United States Patent Office 3,207,601
Patented Sept. 21, 1965

3,207,601
METHODS OF PREPARING ETCH RESISTS USING AN ELECTROSTATIC IMAGE DEVELOPER COMPOSITION INCLUDING A RESIN HARDENER

Edward C. Giaimo, Jr., Princeton, N.J., assignor to Radio Corporation of America, a corporation of Delaware No Drawing. Original application Sept. 2, 1960, Ser. No. 53,608. Divided and this application Oct. 30, 1961, Ser. No. 148,709
9 Claims. (Cl. 96—1)

This is a division of my copending application Serial No. 53,608, filed September 2, 1960.

This invention relates generally to improved methods of producing etch resists and more specifically to improved methods of preparing etched printing plates and printed circuits.

It is frequently desirable to mask selected areas of a surface for various purposes. For example, in the printing arts, a typographic printing plate is often prepared by masking selected areas of the surface of a sheet of metal, such as magnesium, zinc, or copper, with an acid or alkali resist and then etching the unmasked areas of the plate to a desired depth. In the electronic arts, etched circuits are commonly prepared by masking selected areas of the surface of a metal-coated dielectric base with a resist and then etching away the unmasked portions of the metal coating.

Photoetching techniques are commonly employed for producing typographic printing plates and printed circuits. In conventional photoetching processes, the object to be etched, usually a metal plate or metal clad substrate, is coated with a photoresist. The photoresist is then exposed to an ultraviolet light image, usually by a contact exposure, until the exposed photoresist is rendered insoluble or "hardened" in the exposed areas. The unexposed photoresist is washed away and the object etched to the desired depth.

Conventional photoresists generally require relatively long exposures to the ultraviolet light image because of the relative insensitivity of available photoresists. Consequently, it becomes a practical necessity to first prepare a permanent, relatively dense, full-size transparency of the subject matter to be etched. The transparency must then be held firmly against the photoresist during the relatively long, intense exposure to ultraviolet light to obtain the necessary hardening of the photoresist with a minimum loss in resolution. To accomplish this, photoetchers resort to special vacuum frames for holding the transparency in place, and to intense ultraviolet light sources for exposure. Even so, exposure times of ten minutes or more are common.

It is an object of this invention to provide improved methods of producing etch resists on etchable surfaces.

It is another object to provide improved methods of electrically producing etch resists.

It is an additional object to provide improved methods of producing etched printing plates.

It is a further object to provide improved methods of producing printed circuits.

It is still a further object to provide improved electrophotographic methods of producing etched printing plates and printed circuits wherein the need for employing relatively insensitive light-hardenable materials is obviated.

These and other objects and advantages are accomplished by this invention which includes methods of processing etchable plates having on one surface thereof a coating comprising an insulating resinous layer. A latent electrostatic image is produced on the coating and is developed with a toner powder at least a portion of which comprises a cross-linking agent or catalyst for the resinous layer. Once a powder image is developed on the resinous layer, it is heated to catalytically cure the resin layer underlying the powder image to convert it into an etch resist.

In a preferred method of this invention, an etchable plate is provided which has on one surface thereof a photoconductive insulating layer having a resinous component which has molecular chains capable of being cross-linked. A latent electrostatic image is electrophotographically produced on the photoconductive coating and is developed with a catalytic developer powder. As before, once the powder image is heated, the underlying resin is converted into an etch resist.

This invention also includes improved developer materials capable of promoting cross-linking in resins. Such materials comprise finely-divided electroscopic particles which include a resinous thermoplastic material and a cross-linking agent or catalytic material.

Specific examples and additional advantages of the improved methods of this invention are included in the following detailed description.

In accordance with one method of this invention, an etchable plate, such as, for example, magnesium, zinc, or copper has on its surface a resinous coating. A coating resin is selected which is capable of retaining an electrostatic charge and which includes molecular chains capable of being cross-linked at elevated temperatures in the presence of a suitable catalyst to provide on the plate a cured etch resist. The resin is also selected to be soluble in a selected solvent in the uncured state and insoluble therein in the cured state. Suitable resins include the following: vinyl resins, silicones (or resinous polysiloxanes), phenolformaldehyde resins, polystyrenes, alkyd resins, amino resins, high styrene-butadiene resins, and compatible mixtures thereof. Such resins may be dried or cured in air or more rapidly by heat with a catalyst such as a peroxide or a linoleate, naphthanate, octoate, resinate, stearate or tallate of aluminum, cadmium, copper, iron, lead, manganese or zinc. Coating resins and catalysts therefor are more fully described in Organic Coating Technology, vol. 1, by Payne, Wiley and Sons Inc., New York, N.Y.

A latent electrostatic image may be produced on the resin coating, for example, by superimposing thereon a stencil and thereafter exposing the layer through the stencil to an ion producing source such as an array of corona generating wires. The electrostatic image so produced is then developed with finely-divided electroscopic thermoplastic particles. If the developer particles have a triboelectric polarity different from the charge polarity of the electrostatic image they will be attracted to the charges on the coating to produce thereon a direct or positive powder image. If the polarities are the same, the developer particles will be repelled by the charges and will deposit in uncharged areas to produce a reverse or negative powder image. Various other methods for producing and developing electrostatic images are described in "Electrofax" Direct Electrophotographic Printing on Paper, by C. J. Young and H. G. Greig, RCA Review, December 1954, vol. XV, No. 4.

Developer powders made in accordance with this invention comprise particles of electroscopic thermoplastic material which include from less than 2% to above 80% by weight of resin curing catalytic material. The catalytic material may be imbedded in the thermoplastic material or particles of catalytic material may be coated with the thermoplastic material. Some catalytic powders in and of themselves have appropriate triboelectric properties for developing electrostatic images. However, the choice is limited since those which have such properties may not be desirable catalysts for the resin which is to be cured. By combining a resin with a catalyst, it is possible to produce developer powders whose triboelectric properties are primarily determined by the resin component and, hence, the catalyst can then be one which is more desirable from a curing standpoint.

Many natural and synthetic resins, waxes and other low-melting materials comprise suitable thermoplastic components for the developer powders of this invention. For example, any of the following materials for combinations thereof may be used:

(1) Carnauba wax.
(2) Microcrystalline petroleum wax, such as Ultracera Amber Wax, BE Square Wax White or Petronauba D Wax of the Bareco Oil Co., Barnsdall, Oklahoma.
(3) Chemically modified microcrystalline wax such as Polymekon Wax of the Warwick Wax Co., New York, N.Y.
(4) Thermoplastic hydrocarbon terpene resin such as Piccolyte S–135 of the Pennsylvania Industrial Chemical Corporation, Clairton, Pennsylvania.
(5) Synthetic wax—octadecenamide such as Acrawax C of the Glyco Products Co., Brooklyn, New York.

If desired, various pigments or dyes may be included in the developer particles of this invention.

A suitable brown developer powder may be prepared as follows:

*Example I*

90 grams finely-divided Piccolastic resin 4358 (an elastic thermoplastic resin composed of polymers of styrene, substituted styrene and its homologs) marketed by the Pennsylvania Industrial Chemical Corp.
10 grams aluminum octoate.

These materials are thoroughly mixed and melted in a stainless steel container at 200° C. Mixing is accomplished in as short a time as possible. The melt is then poured onto a brass tray to cool and harden.

The hardened mix is then broken up and ball milled for about 20 hours. The melted powder is screened through a 200 mesh screen and is then ready for use as a developer powder. This powder takes on a positive electrostatic charge when mixed with carrier beads or iron powder as described in the aforesaid Young and Greig publication. It therefore develops an electrostatic image composed of negative charges.

Once the electrostatic image has been developed with the developer material, heat is applied to fuse the developed image to the resin coating and to cure the resin underlying the image.

Heating, at a temperature of about 200 to about 250 degrees centigrade for about one minute, is generally sufficient to cure the coating resin and convert it into an etch resist.

A solvent for the coating is now applied to the surface of the image carrying plate in order to remove the non-resist (uncured) areas of the coating, while those areas of the coating which have been cured are left undisturbed. Suitable solvents for a silicone resin coating are methyl, ethyl, butyl or isoamyl alcohols, diacetone, toluene and xylol. Where the solvent merely softens the coating, a cotton swab, for example, dampened with the solvent is applied to the surface wiping away the areas that have been softened.

Once curing of the coating pattern is completed and uncured areas of the coating removed, the plate is ready for etching with a standard etch solution. In the preparation of a printing plate, etching is continued until the desired depth is attained. In the preparation of a printed circuit, the plate to be etched comprises a metal layer bonded to a dielectric base and etching is continued until all metal in uncured areas on the dielectric base is removed. From the foregoing description it is obvious that this invention is equally adapted for preparing plates other than printing plates and printed circuits. Ornamental plaques and name plates are examples of such other plates.

Toner powders may be prepared as set forth in Example I but with different proportions of catalyst and resin.

Toners with the following proportions will also provide satisfactory results in the methods of this invention.

*Example II*

| | Grams |
|---|---|
| Aluminum octoate | 2.5 |
| Resin (Piccolastic 4358) | 97.5 |

*Example III*

| | |
|---|---|
| Aluminum octoate | 5 |
| Resin (Piccolastic 4358) | 95 |

*Example IV*

| | |
|---|---|
| Aluminum octoate | 20 |
| Resin (60 grams Piccolastic 100 and 40 grams grams Piccolastic 125) | 100 |

Difficulty has been experienced in producing toner powders by the process of Example I which include more than 10 or 20% by weight of catalyst. This difficulty, however, is easily overcome by preparing solutions of resin and catalyst as follows:

*Example V*

| | Grams |
|---|---|
| Aluminum octoate | 5 |
| Resin (Piccolastic 4358) | 20 |
| Toluene | 50 |

The catalyst and the resin are dissolved in the toluene and poured onto a metal or glass surface. Once all the toluene has evaporated, a brittle mass of thoroughly mixed resin and catalyst is obtained. This mass is broken up, ground, and classified as to particle size as in Example I. Toner powders which include up to at least 80% catalyst may be prepared in this manner.

In the preferred methods of this invention, electrophotographic processes such as are described in the aforementioned Young and Greig publication are employed. In such processes, an etchable plate is provided which has on one surface thereof a photoconductive insulating coating which includes a resin component. As described in the above publication, one such coating comprises a photoconductive zinc oxide dispersed in a resin binder. Other suitable photoconductors are described in U.S. Patent 2,862,815 to M. L. Sugarman and A. J. Moncrieff-Yeates. The requirements with respect to the resin component for such a photoconductive coating are substantially the same as those for the insulating coating resin earlier described herein. Such a resin component should be one in which a finely-divided photoconductor is easily dispersed and such as to provide a stable dispersion in the final coating. It is essential that the resin be a good insulator and that it have molecular chains which can be cross-linked in the presence of a selected catalyst.

In the electrophotographic processing of a plate having a photoconductive coating, it is usually convenient to first provide on the coating a uniformly distributed electrostatic charge. Such a charge may be produced by passing over the coating a corona generating device comprising an array of fine wires connected to a source of high potential.

Once the coating is charged, it is then exposed to a light image. Exposure may be made by conventional contact printing or projection techniques. Exposure to the light image produces on the coating a latent electrostatic image, the charged areas of which correspond to the dark areas of the original light image.

The latent electrostatic image may be developed into a powder image, as described heretofore, or, in the alternative, development may be accomplished by liquid development techniques. Such techniques may include applying to an electrostatic image a dispersion comprising a finely-divided thermoplastic resin toner dispersed in an insulating liquid, the toner including a catalyst as described heretofore. Suitable insulating liquids include various hydrocarbons as well as trichlorotrifluoroethane and a low viscosity dimethyl polysiloxane or mixtures thereof.

What is claimed is:

1. A method of processing an etchable plate having on one surface thereof a photoconductive insulating layer comprising a finely-divided photoconductor dispersed in a binder of insulating resinous material which is soluble in a selected solvent and which includes molecular chains capable of being cross-linked with a selected cross-linking agent when heated to render the resinous material insoluble in said solvent; said method comprising the steps of: producing a latent electrostatic image on the surface of said resinous layer; developing said electrostatic image into a powder image with a finely-divided thermoplastic material at least a portion of which comprises said selected catalyst; and heating said powder image to cure the portions of said resinous material underlying said powder image to convert said portions into an etch resist.

2. The method of claim 1 including the additional step of etching said plate to a desired depth.

3. The method of claim 1 wherein said plate comprises a metal layer bonded to an insulating base; said method including the additional step of etching away all portions of said metal layer not covered by said etch resist to leave a conductive pattern on said insulating base.

4. A method of producing an etch resist on an etchable plate having a photoconductive insulating coating thereon comprising a finely-divided photoconductor dispersed in a binder of resinous material which is soluble in a selected solvent and which includes molecular chains capable of being cross-linked by heat with a selected cross-linking agent to render the resinous material insoluble in said solvent; said method comprising the steps of: electrophotographically producing a latent electrostatic image on said coating; developing said electrostatic image into a powder image with a finely-divided thermoplastic material at least a portion of which comprises a cross-linking agent for said resinous material, and heating said powder image to cure the portions of said resinous material of said coating underlying said powder image to convert said portions into an etch resist.

5. The method of claim 4 wherein said etch resist is produced on the surface of a metal layer bonded to an insulating base and all portions of said metal layer not covered by said resist are etched away to provide a conductive pattern on said insulating base.

6. The method of claim 4 wherein said etch resist is produced on the surface of a raw printing plate and all areas on said plate not covered by said resist are etched to a desired depth.

7. A method of producing an etch resist on an etchable plate having a photoconductive insulating coating thereon comprising a finely-divided photoconductor dispersed in a binder of insulating resinous material which is soluble in a selected solvent and which includes molecular chains capable of being cross-linked by heat in the presence of a selected cross-linking agent to render to resinous material insoluble in said solvent; said method comprising the steps of:

electrophotographically producing a latent electrostatic image on said coating;

developing said electrostatic image into a powder image with a finely-divided thermoplastic material a substantial portion of which comprises said cross-linking agent;

heating said coating with said powder image thereon to cross-link said resinous material in all portions of said coating which underly said powder and render such material insoluble in said selected solvent; and applying said selected solvent to said coating to remove said photoconductor and said binder from all areas on said plate not covered by said powder.

8. A method of producing an etch resist on an etchable plate having a photoconductive insulating coating thereon comprising a finely-divided photoconductor dispersed in a binder of insulating resinous material which is soluble in a selected solvent and which includes molecular chains capable of being cross-linked by heat in the presence of a selected cross-linking agent to render said resinous material insoluble in said solvent; said method comprising the steps of:

electrophotographically producing a latent electrostatic image on said coating;

developing said electrostatic image into a powder image with developer particles comprising thermoplastic resinous material and 2 to 80 percent by weight of said cross-linking agent;

heating said coating with said powder image thereon to cross-link said resinous material in all portions of said coating which underly said powder and render such material insoluble in said selected solvent; and applying said selected solvent to said coating to remove said photoconductor and said binder from areas on said plate not covered by said powder;

etching said plate to a desired depth in areas thereof from which said photoconductor and binder have been removed.

9. A method of processing an etchable plate having a photoconductive coating thereon comprising a finely-divided photoconductor dispersed in a resinous polysiloxane binder which is soluble in a selected solvent and which includes molecular chains capable of being cross-linked in the presence of aluminum octoate and heat to render said binder insoluble in said solvent; said method comprising the steps of:

electrophotographically producing an electrostatic latent image on said coating;

developing said latent image into a powder image with developer particles comprising thermoplastic resinous material and 2 to 80 percent by weight of aluminum octoate;

heating said coating with said powder image thereon to effect cross-linking of said resinous material in all portions of said coatings which underly said powder and render such material insoluble in said selected solvent; and applying said solvent to said coating to remove said photoconductor and binder from areas on said plate not covered by said powder.

References Cited by the Examiner

UNITED STATES PATENTS

| | | | |
|---|---|---|---|
| 2,579,332 | 12/51 | Nelson | 260—37 |
| 2,857,272 | 10/58 | Grieg | 96—1 |
| 2,907,674 | 10/59 | Metcalfe et al. | 96—1 X |
| 2,919,179 | 12/59 | Van Wagner | 96—1 X |
| 2,939,787 | 6/60 | Giamo | 96—1 |
| 3,041,169 | 6/62 | Wielicki | 96—1 |
| 3,050,019 | 10/62 | Johnson et al. | 96—1 |
| 3,082,181 | 3/63 | Brown et al. | 260—37 |

OTHER REFERENCES

Morgan: "Paint Manufacture," July 1951, vol. XXI, No. 7, pp. 239–248 and 259.

NORMAN G. TORCHIN, *Primary Examiner.*